United States Patent
Maeno (10) Patent No.: US 9,742,383 B2
(45) Date of Patent: Aug. 22, 2017

(54) SEMICONDUCTOR INTEGRATED CIRCUIT

(71) Applicant: Kabushiki Kaisha Toshiba, Minato-Ku, Tokyo (JP)

(72) Inventor: Muneaki Maeno, Yokohama Kanagawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 15/056,294

(22) Filed: Feb. 29, 2016

(65) Prior Publication Data
US 2017/0077909 A1    Mar. 16, 2017

(30) Foreign Application Priority Data
Sep. 11, 2015  (JP) ................. 2015-179388

(51) Int. Cl.
| H03K 3/00 | (2006.01) |
| H03K 3/3562 | (2006.01) |
| G01R 31/3185 | (2006.01) |

(52) U.S. Cl.
CPC .  *H03K 3/35625* (2013.01); *G01R 31/318541* (2013.01)

(58) Field of Classification Search
None
See application file for complete search history.

(56) References Cited

U.S. PATENT DOCUMENTS

| 6,396,306 | B2 | 5/2002 | Dring et al. |
| 7,137,094 | B2 | 11/2006 | Tien |
| 7,221,183 | B2 | 5/2007 | Chen |
| 7,663,851 | B2 | 2/2010 | Huang et al. |
| 7,949,988 | B2 | 5/2011 | Tsai et al. |
| 2002/0078410 | A1 | 6/2002 | Matsushima |
| 2003/0066001 | A1 | 4/2003 | Sera et al. |
| 2009/0066386 | A1* | 3/2009 | Lee ................ H03K 3/35625 327/202 |
| 2011/0032016 | A1 | 2/2011 | Maeno |
| 2011/0254588 | A1 | 10/2011 | Nacer et al. |
| 2014/0225657 | A1 | 8/2014 | Maeno |
| 2014/0289578 | A1* | 9/2014 | Sugiyama ........ G01R 31/31853 714/727 |
| 2016/0094204 | A1* | 3/2016 | Nandi ................. H03K 3/0372 327/203 |

FOREIGN PATENT DOCUMENTS

| JP | 63-224319 A | 9/1988 |
| JP | 05-102312 A | 4/1993 |
| JP | 05-206792 A | 8/1993 |
| JP | 07-095016 A | 4/1995 |
| JP | 2001-141785 A | 5/2001 |
| JP | 2002-139545 A | 5/2002 |
| JP | 2011-055224 A | 3/2011 |

* cited by examiner

*Primary Examiner* — Long Nguyen
(74) *Attorney, Agent, or Firm* — White & Case LLP (57) ABSTRACT

According to one embodiment, a semiconductor integrated circuit comprises: a first flip-flop including a first input circuit, a first latch, a second latch, and a first output circuit; a second flip-flop including a second input circuit, a third latch, a fourth latch, and a second output circuit; and a clock buffer configured to output a common clock signal to the first flip-flop and the second flip-flop. A first output terminal of the second latch is coupled to an input terminal of the first output circuit, and a second output terminal of the second latch is directly coupled to an input terminal of the second input circuit.

7 Claims, 7 Drawing Sheets

FIG. 7

SEMICONDUCTOR INTEGRATED CIRCUIT

CROSS-REFERENCE TO RELATED APPLICATIONS

This application is based upon and claims the benefit of priority from the prior Japanese Patent Application No. 2015-179388, filed Sep. 11, 2015, the entire contents of which are incorporated herein by reference.

FIELD

Embodiments described herein relate generally to a semiconductor integrated circuit.

BACKGROUND

In a semiconductor integrated circuit, a multi-bit flip-flop is used. The multi-bit flip-flop includes a plurality of flip-flops. The plurality of flip-flops share one clock buffer. Hence, in the multi-bit flip-flop, the number of clock buffers can be decreased, and the circuit area and power consumption can be reduced.

On the other hand, as a test method (failure analysis) of the semiconductor integrated circuit, a scan test method is used. In the scan test, the plurality of flip-flops in the multi-bit flip-flop are electrically coupled as a parallel type or serial type scan chain.

In the parallel type, a scan test data signal is input to the scan input terminal of the flip-flop of each bit in the multi-bit flip-flop. The scan test data signal is output to the scan output terminal of the flip-flop of each bit. That is, the scan test is executed using the scan test data signal output from the scan output terminal of the flip-flop of each bit.

In the serial type, a scan test data signal is input to the scan input terminal of the flip-flop of the first bit (first stage) in the multi-bit flip-flop and output from the scan output terminal. Then, the scan test data signal is input to the scan input terminal of the flip-flop of the second bit. When the scan test data signal is output from the scan output terminal of the flip-flop of the second bit, the scan test data signal is input to the scan input terminal of the flip-flop of the third bit. In a similar manner, the scan test data signal is input to the scan input terminal of the flip-flop of the final bit and output from the scan output terminal. The scan test is executed using the scan test data signal output from the scan output terminal of the flip-flop of the final bit.

In the scan test of the serial type, since a logic circuit or a long wire is electrically coupled to the scan output terminal of each flip-flop in the multi-bit flip-flop, there is the influence of a load capacity and the like. In this case, the scan test data signal from the scan output terminal of each flip-flop changes its waveform and is then input to the scan input terminal of the next flip-flop. As a result, the reliability of the scan test lowers.

Additionally, to suppress the influence of the load capacity, a new buffer circuit or the like is necessary. In this case, the circuit area increases.

DETAILED DESCRIPTION

In general, according to one embodiment, a semiconductor integrated circuit includes: a first flip-flop including a first input circuit, a first latch, a second latch, and a first output circuit; a second flip-flop including a second input circuit, a third latch, a fourth latch, and a second output circuit; and a clock buffer configured to output a common clock signal to the first flip-flop and the second flip-flop. A first output terminal of the second latch is coupled to an input terminal of the first output circuit, and a second output terminal of the second latch is directly coupled to an input terminal of the second input circuit.

Embodiments will now be described with reference to the accompanying drawing. The same reference numerals denote the same parts throughout the drawing.

First Embodiment

A semiconductor integrated circuit according to the first embodiment will be described below with reference to FIGS. 1 and 2.

According to the first embodiment, in a multi-bit flip-flop, a slave latch 13 of a first flip-flop 10 has a first output terminal and a second output terminal. The first output terminal is electrically coupled to a normal output terminal Q via an output circuit 14. On the other hand, the second output terminal serves as a scan output terminal SO. That is, the normal output terminal Q and the scan output terminal SO are not formed from the same terminal. This can raise the reliability of a scan test and prevent an increase in the circuit area. The first embodiment will be described below in detail.

(Arrangement Example of First Embodiment)

An arrangement example of the semiconductor integrated circuit according to the first embodiment will be described first.

Figure 1:
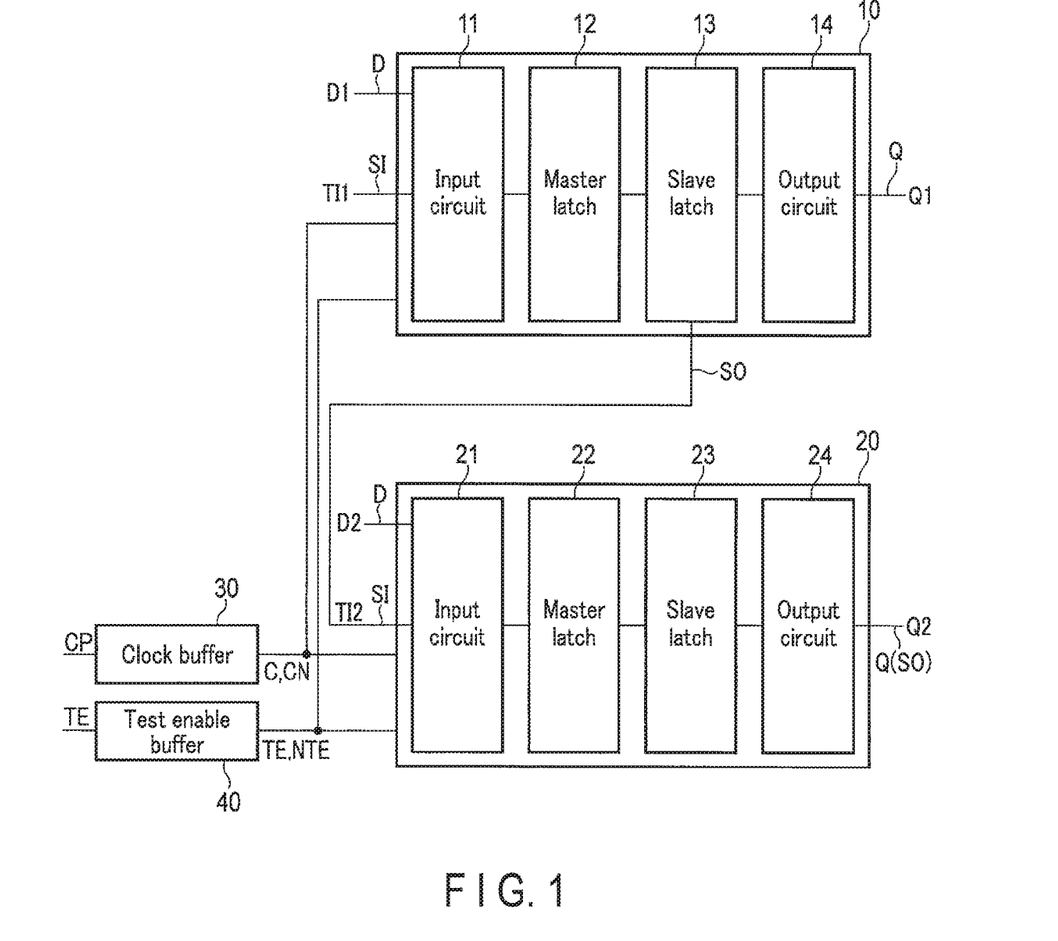
FIG. 1 is a block diagram showing a semiconductor integrated circuit according to the first embodiment.

FIG. 1 is a block diagram showing the semiconductor integrated circuit according to the first embodiment. FIG. 1 shows a 2-stage multi-bit flip-flop including the first flip-flop 10 and a second flip-flop 20.

Note that in the following explanation, "connection" includes not only direct connection but also connection via an arbitrary element, unless otherwise specified.

As shown in FIG. 1, the semiconductor integrated circuit includes the first flip-flop 10, the second flip-flop 20, a clock buffer 30, and a test enable buffer 40.

The first flip-flop 10 includes an input circuit 11, a master latch 12, the slave latch 13, and the output circuit 14.

The input circuit 11 has a first input terminal (normal input terminal D), a second input terminal (scan input terminal SI), and an output terminal. A normal data signal D1 is input to the first input terminal in a normal operation. A scan test data signal TI1 is input to the second input terminal in a scan test operation. The input circuit 11 selectively outputs one of the inputs, that is, the normal data signal D1 and the scan test data signal TI1 in accordance with a test enable signal TE and an inverted test enable signal NTE from the test enable buffer 40.

The master latch 12 has an input terminal and an output terminal. The input terminal of the master latch 12 is electrically coupled to the output terminal of the input circuit 11. The master latch 12 receives the output from the input circuit 11 or holds the received data in accordance with a clock signal C and an inverted clock signal CN from the clock buffer 30. The master latch 12 outputs the received data to the output terminal.

The slave latch 13 has an input terminal, a first output terminal, and a second output terminal (scan output terminal SO). The input terminal of the slave latch 13 is electrically coupled to the output terminal of the master latch 12. The slave latch 13 receives the output from the master latch 12 or holds the received data in accordance with the clock signal C and the inverted clock signal CN from the clock buffer 30. The slave latch 13 outputs the received data to first output terminal and the second output terminal.

The output circuit 14 has an input terminal and an output terminal (normal output terminal Q). The input terminal of the output circuit 14 is electrically coupled to the first output terminal of the slave latch 13. The output circuit 14 outputs an output signal Q1 based on the signal from the slave latch 13 to the outside (for example, a logic circuit (not shown)).

The second flip-flop 20 includes an input circuit 21, a master latch 22, a slave latch 23, and an output circuit 24.

The input circuit 21 has a first input terminal (normal input terminal D), a second input terminal (scan input terminal SI), and an output terminal. The second input terminal of the input circuit 21 is electrically directly coupled to the second output terminal of the slave latch 13. That is, no logic circuit exists between the second input terminal of the input circuit 21 and the second output terminal of the slave latch 13. A normal data signal D2 is input to the first input terminal of the input circuit 21 in a normal operation. A scan test data signal TI2 is input to the second input terminal in a scan test operation. The scan test data signal TI2 has the same phase as the output signal from the second output terminal of the slave latch 13. The input circuit 21 selectively outputs one of the inputs, that is, the normal data signal D2 and the scan test data signal TI2 in accordance with the test enable signal TE and the inverted test enable signal NTE from the test enable buffer 40.

The master latch 22 has an input terminal and an output terminal. The input terminal of the master latch 22 is electrically coupled to the output terminal of the input circuit 21. The master latch 22 receives the output from the input circuit 21 or holds the received value in accordance with the clock signal C and the inverted clock signal CN from the clock buffer 30. The master latch 22 outputs the received value to the output terminal.

The slave latch 23 has an input terminal and an output terminal. The input terminal of the slave latch 23 is electrically coupled to the output terminal of the master latch 22. The slave latch 23 receives the output from the master latch 22 or holds the received value in accordance with the clock signal C and the inverted clock signal CN from the clock buffer 30. The slave latch 23 outputs the received value to output terminal.

The output circuit 24 has an input terminal and an output terminal (serving as both the normal output terminal Q and the scan output terminal SO). The input terminal of the output circuit 24 is electrically coupled to the first output terminal of the slave latch 23. The output circuit 24 outputs an output signal Q2 based on the signal from the slave latch 23 to the outside (for example, a logic circuit (not shown)).

The clock buffer 30 outputs the clock signal C and the inverted clock signal CN commonly to the first flip-flop 10 and the second flip-flop 20.

The test enable buffer 40 outputs the test enable signal TE and the inverted test enable signal NTE commonly to the first flip-flop 10 and the second flip-flop 20.

Figure 2:
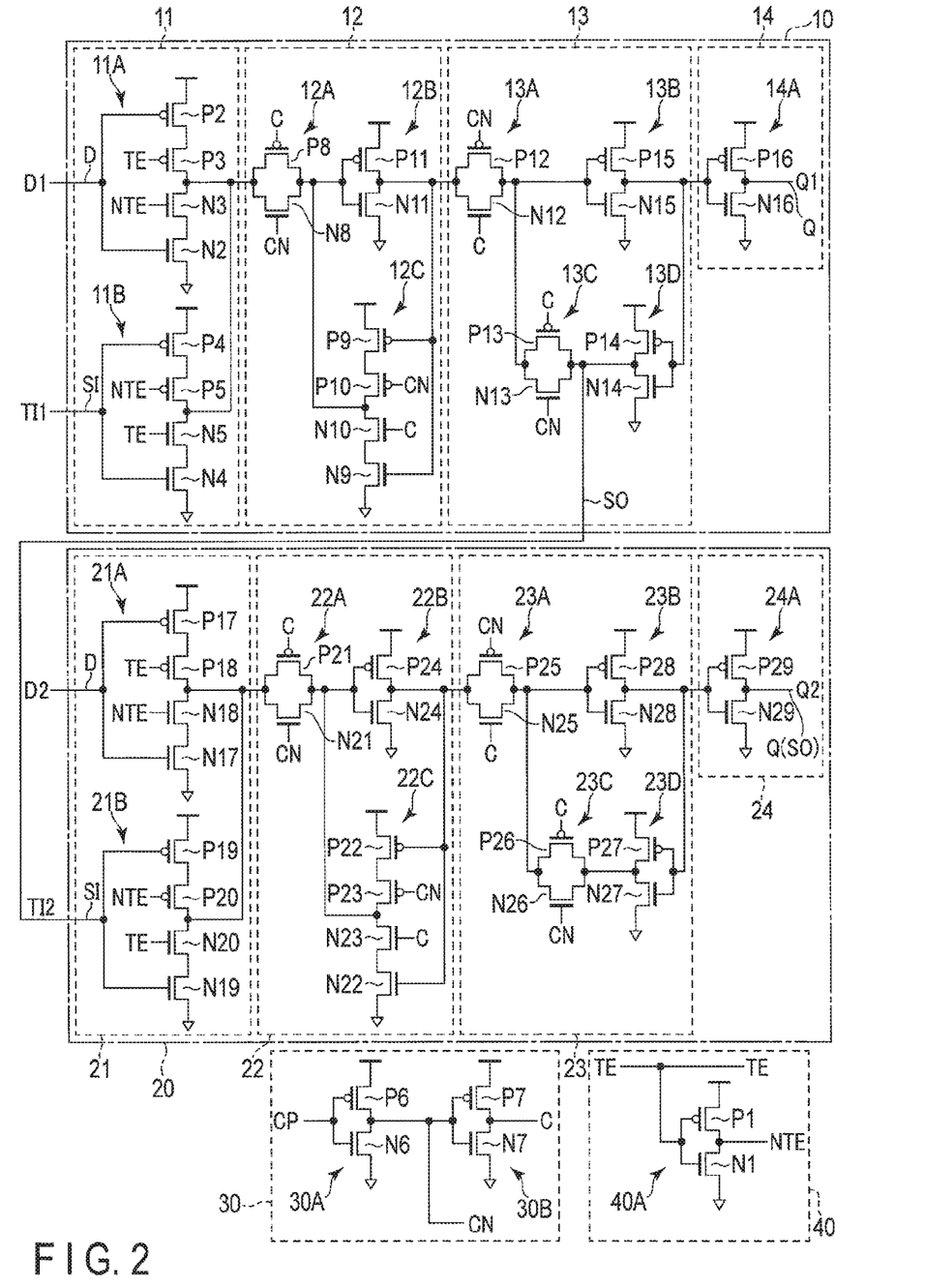
FIG. 2 is a circuit diagram showing the semiconductor integrated circuit according to the first embodiment.

FIG. 2 is a circuit diagram showing the semiconductor integrated circuit according to the first embodiment. FIG. 2 illustrates details of the first flip-flop 10 (the input circuit 11, the master latch 12, the slave latch 13, and the output circuit 14), the second flip-flop 20 (the input circuit 21, the master latch 22, the slave latch 23, and the output circuit 24), the clock buffer 30, and the test enable buffer 40 shown in FIG. 1.

As shown in FIG. 2, the input circuit 11 of the first flip-flop 10 includes clocked inverters 11A and 11B.

The input of the clocked inverter 11A is the first input terminal (normal input terminal D) of the input circuit 11, and the output is the output terminal of the input circuit 11. The input of the clocked inverter 11B is the second input terminal (scan input terminal SI) of the input circuit 11, and the output is the output terminal of the input circuit 11, as in the clocked inverter 11A.

More specifically, the clocked inverter 11A includes PMOS transistors P2 and P3 and NMOS transistors N2 and N3. The clocked inverter 11B includes PMOS transistors P4 and P5 and NMOS transistors N4 and N5.

One terminal of the PMOS transistor P2 is electrically coupled to a power supply voltage, and the other terminal of the PMOS transistor P2 is electrically coupled to one terminal of the PMOS transistor P3. The other terminal of the PMOS transistor P3 is electrically coupled to one terminal of the NMOS transistor N3. The other terminal of the NMOS transistor N3 is electrically coupled to one terminal of the NMOS transistor N2. The other terminal of the NMOS transistor N2 is electrically coupled to a ground voltage. The gates of the PMOS transistor P2 and the NMOS transistor N2 form the input of the clocked inverter 11A, and the normal data signal D1 is input to the gates. The test enable signal TE is input to the gate of the PMOS transistor P3, and the inverted test enable signal NTE is input to the gate of the NMOS transistor N3. The other terminal of the PMOS transistor P3 and the one terminal of the NMOS transistor N3 form the output of the clocked inverter 11A.

One terminal of the PMOS transistor P4 is electrically coupled to the power supply voltage, and the other terminal of the PMOS transistor P4 is electrically coupled to one terminal of the PMOS transistor P5. The other terminal of the PMOS transistor P5 is electrically coupled to one terminal of the NMOS transistor N5. The other terminal of the NMOS transistor N5 is electrically coupled to one terminal of the NMOS transistor N4. The other terminal of the NMOS transistor N4 is electrically coupled to the ground voltage. The gates of the PMOS transistor P4 and the NMOS transistor N4 form the input of the clocked inverter 11B, and the scan test data signal TI1 is input to the gates. The inverted test enable signal NTE is input to the gate of the PMOS transistor P5, and the test enable signal TE is input to the gate of the NMOS transistor N5. The other terminal of the PMOS transistor P5 and the one terminal of the NMOS transistor N5 form the output of the clocked inverter 11B.

The master latch 12 of the first flip-flop 10 includes a transfer gate 12A, an inverter 12B, and a clocked inverter 12C.

The input of the transfer gate 12A is the input terminal of the master latch 12, and is electrically coupled to the output terminal of the input circuit 11. The output of the transfer gate 12A is electrically coupled to the input of the inverter 12B. The output of the inverter 12B is the output terminal of the master latch 12, and is electrically coupled to the input of the clocked inverter 12C. The output of the clocked inverter 12C is electrically coupled to the output of the transfer gate 12A and the input of the inverter 12B. That is, the clocked inverter 12C is a feedback circuit.

More specifically, the transfer gate 12A includes a PMOS transistor P8 and an NMOS transistor N8. The inverter 12B includes a PMOS transistor P11 and an NMOS transistor N1. The clocked inverter 12C includes PMOS transistors P9 and P10 and NMOS transistors N9 and N10.

One terminal of the PMOS transistor P8 is electrically coupled to one terminal of the NMOS transistor N8, and the other terminal of the PMOS transistor P8 is electrically coupled to the other terminal of the NMOS transistor N8. The one terminal of the PMOS transistor P8 and the one terminal of the NMOS transistor N8 form the input of the transfer gate 12A, and the other terminal of the PMOS transistor P8 and the other terminal of the NMOS transistor N8 form the output of the transfer gate 12A. The clock signal C is input to the gate of the PMOS transistor P8, and the inverted clock signal CN is input to the gate of the NMOS transistor N8.

One terminal of the PMOS transistor P11 is electrically coupled to the power supply voltage, and the other terminal of the PMOS transistor P11 is electrically coupled to one terminal of the NMOS transistor N11. The other terminal of the NMOS transistor N11 is electrically coupled to the ground voltage. The gates of the PMOS transistor P11 and the NMOS transistor N11 form the input of the inverter 12B. The other terminal of the PMOS transistor P11 and the one terminal of the NMOS transistor N11 form the output of the inverter 12B.

One terminal of the PMOS transistor P9 is electrically coupled to the power supply voltage, and the other terminal of the PMOS transistor P9 is electrically coupled to one terminal of the PMOS transistor P10. The other terminal of the PMOS transistor P10 is electrically coupled to one terminal of the NMOS transistor N10, and the other terminal of the NMOS transistor N10 is electrically coupled to one terminal of the NMOS transistor N9. The other terminal of the NMOS transistor N9 is electrically coupled to the ground voltage. The gates of the PMOS transistor P9 and the NMOS transistor N9 form the input of the clocked inverter 12C. The inverted clock signal CN is input to the gate of the PMOS transistor P10. The clock signal C is input to the gate of the NMOS transistor N10. The other terminal of the PMOS transistor P10 and the one terminal of the NMOS transistor N10 form the output of the clocked inverter 12C.

The slave latch 13 of the first flip-flop 10 includes a transfer gate 13A, an inverter 13B, a transfer gate 13C, and an inverter 13D.

The input of the transfer gate 13A is the input terminal of the slave latch 13, and is electrically coupled to the output terminal of the master latch 12. The output of the transfer gate 13A is electrically coupled to the input of the inverter 13B. The output of the inverter 13B is the first output terminal of the slave latch 13, and is electrically coupled to the input of the inverter 13D. The output of the inverter 13D is the second output terminal (scan output terminal SO) of the slave latch 13, and is electrically coupled to the input of the transfer gate 13C. In other words, the connection terminal between the inverter 13D and the transfer gate 13C is the scan output terminal SO. The output of the transfer gate 13C is electrically coupled to the output of the transfer gate 13A and the input of the inverter 13B. That is, the transfer gate 13C and the inverter 13D form a feedback circuit.

More specifically, the transfer gate 13A includes a PMOS transistor P12 and an NMOS transistor N12. The inverter 13B includes a PMOS transistor P15 and an NMOS transistor N15. The transfer gate 13C includes a PMOS transistor P13 and an NMOS transistor N13. The inverter 13D includes a PMOS transistor P14 and an NMOS transistor N14.

One terminal of the PMOS transistor P12 is electrically coupled to one terminal of the NMOS transistor N12, and the other terminal of the PMOS transistor P12 is electrically coupled to the other terminal of the NMOS transistor N12. The one terminal of the PMOS transistor P12 and the one terminal of the NMOS transistor N12 form the input of the transfer gate 13A. The other terminal of the PMOS transistor P12 and the other terminal of the NMOS transistor N12 form the output of the transfer gate 13A. The inverted clock signal CN is input to the gate of the PMOS transistor P12, and the clock signal C is input to the gate of the NMOS transistor N12.

One terminal of the PMOS transistor P15 is electrically coupled to the power supply voltage, and the other terminal of the PMOS transistor P15 is electrically coupled to one terminal of the NMOS transistor N15. The other terminal of the NMOS transistor N15 is electrically coupled to the ground voltage. The gates of the PMOS transistor P15 and the NMOS transistor N15 form the input of the inverter 13B. The other terminal of the PMOS transistor P15 and the one terminal of the NMOS transistor N15 form the output of the inverter 13B.

One terminal of the PMOS transistor P14 is electrically coupled to the power supply voltage, and the other terminal of the PMOS transistor P14 is electrically coupled to one terminal of the NMOS transistor N14. The other terminal of the NMOS transistor N14 is electrically coupled to the ground voltage. The gates of the PMOS transistor P14 and the NMOS transistor N14 form the input of the inverter 13D, and the other terminal of the PMOS transistor P14 and the one terminal of the NMOS transistor N14 form the output of the inverter 13D.

One terminal of the PMOS transistor P13 is electrically coupled to one terminal of the NMOS transistor N13, and the other terminal of the PMOS transistor P13 is electrically coupled to the other terminal of the NMOS transistor N13. The one terminal of the PMOS transistor P13 and the one terminal of the NMOS transistor N13 form the input of the transfer gate 13C, and the other terminal of the PMOS transistor P13 and the other terminal of the NMOS transistor N13 form the output of the transfer gate 13C. The clock signal C is input to the gate of the PMOS transistor P13, and the inverted clock signal CN is input to the gate of the NMOS transistor N13.

The output circuit 14 of the first flip-flop 10 includes an inverter 14A.

The input of the inverter 14A is the input terminal of the output circuit 14, and is electrically coupled to the first output terminal of the slave latch 13. The output of the inverter 14A is the output terminal (normal output terminal Q) of the output circuit 14.

More specifically, the inverter 14A includes a PMOS transistor P16 and an NMOS transistor N16.

One terminal of the PMOS transistor P16 is electrically coupled to the power supply voltage, and the other terminal of the PMOS transistor P16 is electrically coupled to one terminal of the NMOS transistor N16. The other terminal of the NMOS transistor N16 is electrically coupled to the ground voltage. The gates of the PMOS transistor P16 and the NMOS transistor N16 form the input of the inverter 14A, and the other terminal of the PMOS transistor P16 and the one terminal of the NMOS transistor N16 form the output of the inverter 14A.

The input circuit 21, the master latch 22, the slave latch 23, and the output circuit 24 of the second flip-flop 20 have the same structures as the input circuit 11, the master latch 12, the slave latch 13, and the output circuit 14 of the first flip-flop 10, respectively.

More specifically, the input circuit 21 of the second flip-flop 20 includes clocked inverters 21A and 21B. The input of the clocked inverter 21B is the input terminal of the input circuit 21, and is electrically directly coupled to the scan output terminal SO of the slave latch 13. The clocked inverter 21A includes PMOS transistors P17 and P18 and NMOS transistors N17 and N18. The clocked inverter 21B includes PMOS transistors P19 and P20 and NMOS transistors N19 and N20.

The master latch 22 of the second flip-flop 20 includes a transfer gate 22A, an inverter 22B, and a clocked inverter 22C. The transfer gate 22A includes a PMOS transistor P21 and an NMOS transistor N21. The inverter 22B includes a PMOS transistor P24 and an NMOS transistor N24. The clocked inverter 22C includes PMOS transistors P22 and P23 and NMOS transistors N22 and N23.

The slave latch 23 of the second flip-flop 20 includes a transfer gate 23A, an inverter 23B, a transfer gate 23C, and an inverter 23D. The transfer gate 23A includes a PMOS transistor P25 and an NMOS transistor N25. The inverter 23B includes a PMOS transistor P28 and an NMOS transistor N28. The transfer gate 23C includes a PMOS transistor P26 and an NMOS transistor N26. The inverter 23D includes a PMOS transistor P27 and an NMOS transistor N27.

The output circuit 24 of the second flip-flop 20 includes an inverter 24A. The output of the inverter 24A is the output terminal (serving as both the normal output terminal Q and the scan output terminal SO) of the output circuit 24. The inverter 24A includes a PMOS transistor P29 and an NMOS transistor N29.

The clock buffer 30 includes inverters 30A and 30B.

The input of the inverter 30A is the input terminal of the clock buffer 30, and a clock input signal CP is input to the input terminal. The output of the inverter 30A is the first output terminal of the clock buffer 30, and the inverted clock signal CN is output from the first output terminal. The output of the inverter 30A is electrically coupled to the input of the inverter 30B. The output of the inverter 30B is the second output terminal of the clock buffer 30, and the clock signal C is output from the second output terminal.

More specifically, the inverter 30A includes a PMOS transistor P6 and an NMOS transistor N6. The inverter 30B includes a PMOS transistor P7 and an NMOS transistor N7.

One terminal of the PMOS transistor P6 is electrically coupled to the power supply voltage, and the other terminal of the PMOS transistor P6 is electrically coupled to one terminal of the NMOS transistor N6. The other terminal of the NMOS transistor N6 is electrically coupled to the ground voltage. The gates of the PMOS transistor P6 and the NMOS transistor N6 form the input of the inverter 30A, and the other terminal of the PMOS transistor P6 and the one terminal of the NMOS transistor N6 form the output of the inverter 30A.

One terminal of the PMOS transistor P7 is electrically coupled to the power supply voltage, and the other terminal of the PMOS transistor P7 is electrically coupled to one terminal of the NMOS transistor N7. The other terminal of the NMOS transistor N7 is electrically coupled to the ground voltage. The gates of the PMOS transistor P7 and the NMOS transistor N7 form the input of the inverter 30B, and the other terminal of the PMOS transistor P7 and the one terminal of the NMOS transistor N7 form the output of the inverter 30B.

The test enable buffer 40 includes an inverter 40A.

The input of the inverter 40A is the input terminal of the test enable buffer 40, and the test enable signal TE is input to the input terminal. The output of the inverter 40A is the first output terminal of the test enable buffer 40, and the inverted test enable signal NTE is output from the first output terminal. In addition, the test enable buffer 40 outputs the input test enable signal TE directly from the second output terminal.

More specifically, the inverter 40A includes a PMOS transistor P1 and an NMOS transistor N1.

One terminal of the PMOS transistor P1 is electrically coupled to the power supply voltage, and the other terminal of the PMOS transistor P1 is electrically coupled to one terminal of the NMOS transistor N1. The other terminal of the NMOS transistor N1 is electrically coupled to the ground voltage. The gates of the PMOS transistor P1 and the NMOS transistor N1 form the input of the inverter 40A, and the other terminal of the PMOS transistor P1 and the one terminal of the NMOS transistor N1 form the output of the inverter 40A.

(Operation Example of First Embodiment)

An operation example of each circuit of the semiconductor integrated circuit according to the first embodiment will be described next.

The clock buffer 30 operates as follows.

The clock buffer 30 inverts the clock input signal CP by the inverter 30A, and outputs the inverted clock signal CN to the master latches 12 and 22 and the slave latches 13 and 23. The clock buffer 30 also inverts the inverted clock signal CN by the inverter 30B, and outputs the clock signal C to the master latches 12 and 22 and the slave latches 13 and 23.

The test enable buffer 40 operates as follows.

The test enable buffer 40 inverts the test enable signal TE by the inverter 40A, and outputs the inverted test enable signal NTE to the input circuits 11 and 21. The test enable buffer 40 also directly outputs the test enable signal TE to the input circuits 11 and 21.

The first flip-flop 10 operates as follows.

In the input circuit 11, when the inverted test enable signal NTE is at "H (High)" level (when the test enable signal is at "L (Low)" level), the PMOS transistor P3 and the NMOS transistor N3 of the clocked inverter 11A are turned on, thereby inverting the normal data signal D1 and outputting it. On the other hand, in the input circuit 11, when the test enable signal TE is at "H (High)" level (when the inverted test enable signal NTE is at "L (Low)" level), the PMOS transistor P5 and the NMOS transistor N5 of the clocked inverter 11B are turned on, thereby inverting the scan test data signal TI1 and outputting it.

In the master latch 12, when the clock signal C is "L" (when the inverted clock signal CN is "H"), the PMOS transistor P8 and the NMOS transistor N8 of the transfer gate 12A are turned on, and the PMOS transistor P10 and the NMOS transistor N10 of the clocked inverter 12C are turned off, thereby receiving the output from the input circuit 11. On the other hand, in the master latch 12, when the clock signal C is "H" (when the inverted clock signal CN is "L"), the PMOS transistor P8 and the NMOS transistor N8 of the transfer gate 12A are turned off, and the PMOS transistor P10 and the NMOS transistor N10 of the clocked inverter 12C are turned on, thereby holding the received data.

In the slave latch 13, when the clock signal C is "H" (when the inverted clock signal CN is "L"), the PMOS transistor P12 and the NMOS transistor N12 of the transfer gate 13A are turned on, and the PMOS transistor P13 and the NMOS transistor N13 of the transfer gate 13C are turned off, thereby receiving the output from the master latch 12. On the other hand, in the slave latch 13, when the clock signal C is "L" (when the inverted clock signal CN is "H"), the PMOS transistor P12 and the NMOS transistor N12 of the transfer gate 13A are turned off, and the PMOS transistor P13 and the NMOS transistor N13 of the transfer gate 13C are turned on, thereby holding the received data.

In addition, the slave latch 13 outputs a signal based on the signal from the master latch 12 from the output (first output terminal) of the inverter 13B to the output circuit 14, and also outputs the signal based on the signal from the master latch 12 from the output (second output terminal) of the inverter 13D to the input circuit 21 of the second flip-flop 20.

The output circuit 14 inverts the output from the slave latch 13 by the inverter 14A, and outputs the output signal Q1 to the outside.

The second flip-flop 20 performs the same operation as the first flip-flop, and a description thereof will be omitted here.

(Scan Test of First Embodiment)

The scan test of the semiconductor integrated circuit according to the first embodiment will be described next.

In a scan test mode, a scan chain is provided. The scan chain includes the first flip-flop 10 and the second flip-flop 20, and operates as a 2-stage shift register. This will be described below in detail.

In the scan test mode, first, the test enable signal TE is set to "H" level, and the input circuit 11 of the first flip-flop 10 selects the scan test data signal TI1. The input circuit 11 thus outputs the inverted signal (reverse phase signal) of the scan test data signal TI1 via the clocked inverter 11B.

Next, the master latch 12 of the first flip-flop 10 receives the output signal from the input circuit 11. The master latch 12 then outputs the normal signal (in-phase signal) of the scan test data signal TI1 via the transfer gate 12A and the inverter 12B.

The slave latch 13 of the first flip-flop 10 receives the output signal from the master latch 12. The slave latch 13 outputs the normal signal of the scan test data signal TI1 from the scan output terminal SO via the transfer gate 13A and the inverters 13B and 13D. The output signal from the scan output terminal SO is a signal having the same phase as the output signal Q1 output from the normal output terminal Q via the transfer gate 13A and the inverters 13B and 14A. That is, the output signal from the scan output terminal SO and the output signal from the normal output terminal Q are substantially identical. The output signal from the scan output terminal SO is input to the scan input terminal SI of the second flip-flop 20.

After that, the input circuit 21 of the second flip-flop 20 selects the scan test data signal TI2. The normal signal of the scan test data signal TI2 is output from the scan output terminal SO via the input circuit 21, the master latch 22, the slave latch 23, and the output circuit 24 of the second flip-flop 20, as in the operations of the input circuit 11, the master latch 12, the slave latch 13, and the output circuit 14 of the first flip-flop 10.

Effects of First Embodiment

Figure 6:
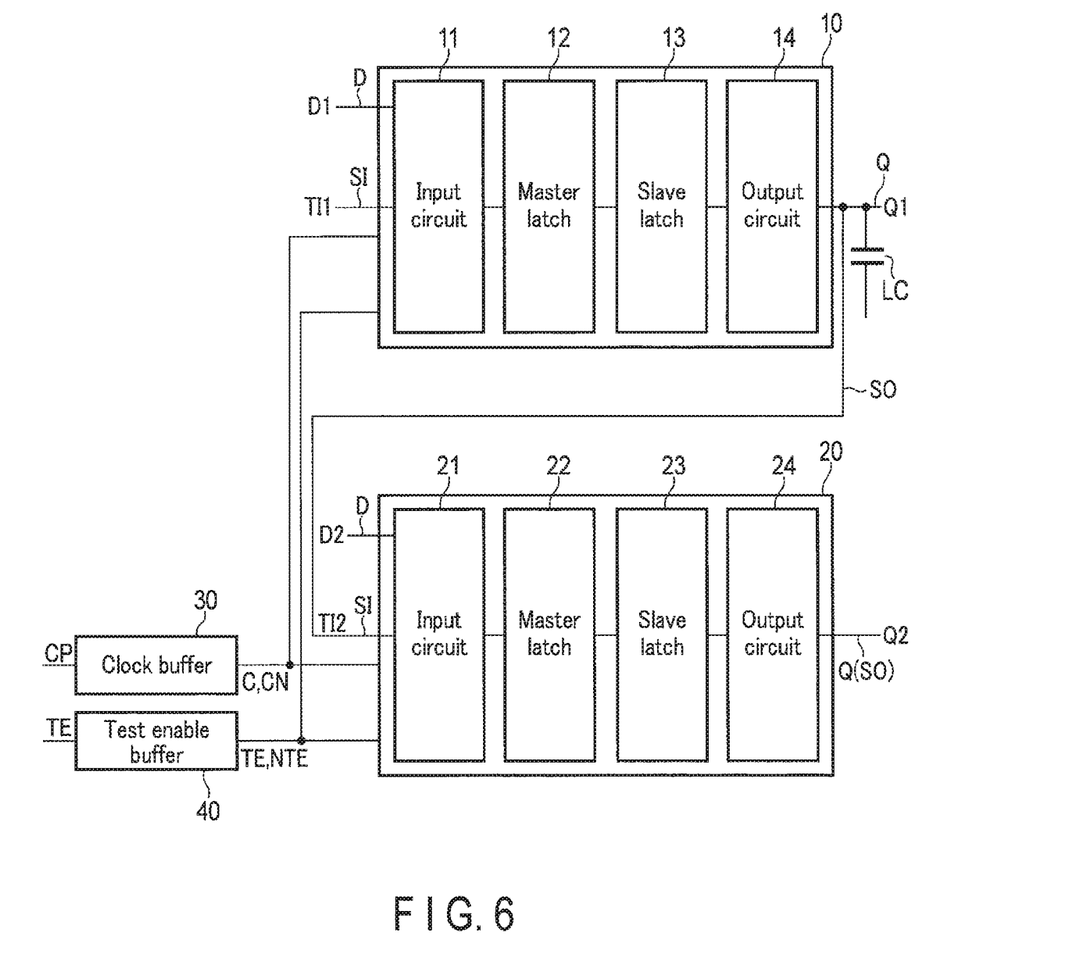
FIG. 6 is a block diagram showing a semiconductor integrated circuit according to the first comparative example.
Figure 7:
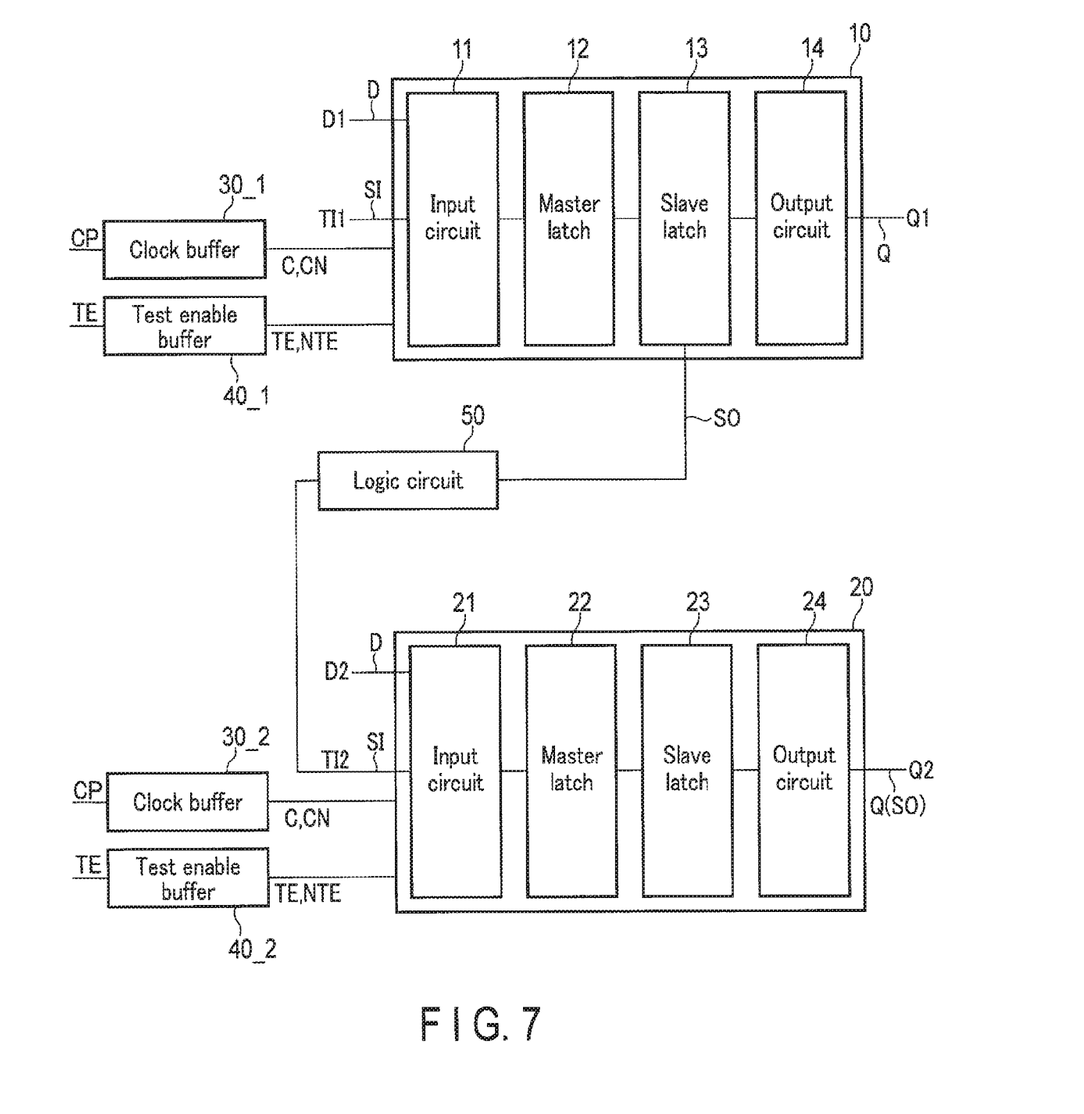
FIG. 7 is a block diagram showing a semiconductor integrated circuit according to the second comparative example.

FIG. 6 is a block diagram showing a semiconductor integrated circuit according to the first comparative example, and FIG. 7 is a block diagram showing a semiconductor integrated circuit according to the second comparative example.

As shown in FIG. 6, according to the first comparative example, in the scan chain of the multi-bit flip-flop, the same terminal serves as both the scan output terminal SO and the normal output terminal Q of the first flip-flop (the flip-flop of the first stage) 10. A wire or logic circuit (not shown) is coupled to the normal output terminal Q. For this reason, a load capacity LC by the wire or logic circuit (not shown) is applied to the scan output terminal SO. This influences to change the waveform of the signal (scan test data signal TI2) from the scan output terminal SO of the first flip-flop 10 to the scan input terminal SI of the second flip-flop (the flip-flop of the second stage) 20. Accordingly, the reliability of the scan test lowers. Additionally, to suppress the waveform variation, a new logic circuit or the like is needed, resulting in an increase in the circuit area.

According to the first embodiment, however, in the multi-bit flip-flop, the slave latch 13 of the first flip-flop 10 has the first output terminal and the second output terminal. The first output terminal is the output of the inverter 13B of the slave latch 13, and is electrically coupled to the normal output terminal Q via the output circuit 14. On the other hand, the second output terminal is the output of the inverter 13D of the slave latch 13, which outputs a signal having the same phase as the normal output terminal Q. The second output terminal serves as the scan output terminal SO. That is, the normal output terminal Q and the scan output terminal SO are not formed from the same terminal. For this reason, the scan output terminal SO is not affected by the load capacity LC of the wire or logic circuit (not shown) on the side of the normal output terminal Q. Hence, the reliability of the scan test can be raised. In addition, a new logic circuit is not needed, and the circuit area does not increase.

As shown in FIG. 7, according to the second comparative example, in the scan chain of a single flip-flop, the scan output terminal SO of the first flip-flop 10 is the second output terminal of the slave latch 13. However, in the second comparative example, since the single flip-flop forms the scan chain, the distance between the scan output terminal SO of the first flip-flop 10 and the scan input terminal SI of the second flip-flop 20 is long. In addition, a logic circuit 50 is provided between the scan output terminal SO of the first flip-flop 10 and the scan input terminal SI of the second flip-flop 20. These influence to change the waveform of the signal from the scan output terminal SO of the first flip-flop 10 to the scan input terminal SI of the second flip-flop 20. Accordingly, the reliability of the scan test lowers.

According to the first embodiment, however, since the multi-bit flip-flop is used, the distance between the scan output terminal SO of the first flip-flop 10 and the scan input terminal SI of the second flip-flop 20 is shorter than in the second comparative example. For this reason, no logic circuit or the like exists between the scan output terminal SO of the first flip-flop 10 and the scan input terminal SI of the second flip-flop 20, and these terminals are directly coupled. Hence, the reliability of the scan test can be raised. In addition, the circuit area does not increase.

Furthermore, in the single flip-flop according to the second comparative example, not only a clock buffer 30_1 and a test enable buffer 40_1 but also a clock buffer 30_2 and a test enable buffer 40_2 are provided. For this reason, power consumption increases.

In the first embodiment, since the multi-bit flip-flop is used, power consumption can also be suppressed.

Note that in the first embodiment, an example of a 2-stage flip-flop has been described as the multi-bit flip-flop. However, the present invention is not limited to this, and flip-flops of three or more stages may be used. In this case, the scan input terminal SI of the flip-flop of the third or subsequent stage is electrically coupled to the scan output terminal in the slave latch of the flip-flop of the preceding stage.

Second Embodiment

A semiconductor integrated circuit according to the second embodiment will be described below with reference to FIG. 3.

In the first embodiment, the output of the inverter 13D of the slave latch 13 serves as the scan output terminal SO. In the second embodiment, however, the output of a transfer gate 13A of a slave latch 13 serves as a scan output terminal SO. With this arrangement, the same effects as in the first embodiment can be obtained.

The second embodiment will be described below in detail. Note that a description of the same points as in the first embodiment will be omitted in the second embodiment, and different points will mainly be explained.

(Arrangement Example and Operation Example of Second Embodiment)

An arrangement example and an operation example of the semiconductor integrated circuit according to the second embodiment will be described first.

Figure 3:
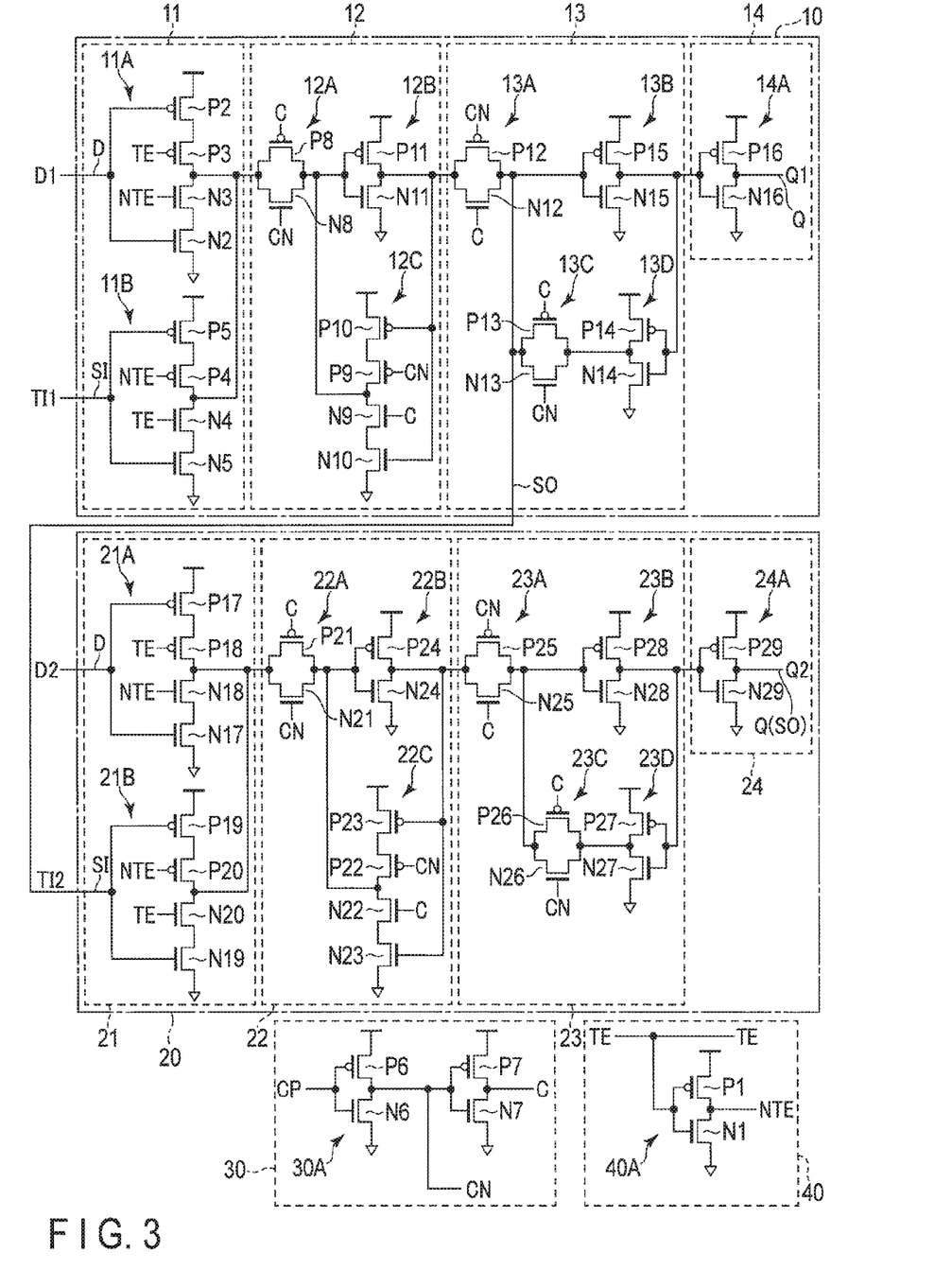
FIG. 3 is a circuit diagram showing a semiconductor integrated circuit according to the second embodiment.

FIG. 3 is a circuit diagram showing the semiconductor integrated circuit according to the second embodiment. FIG. 3 illustrates details of a first flip-flop 10 (an input circuit 11, a master latch 12, a slave latch 13, and an output circuit 14), a second flip-flop 20 (an input circuit 21, a master latch 22, a slave latch 23, and an output circuit 24), a clock buffer 30, and a test enable buffer 40 shown in FIG. 1.

As shown in FIG. 3, the slave latch 13 of the first flip-flop 10 includes the transfer gate 13A, an inverter 13B, a transfer gate 13C, and an inverter 13D.

The output of the transfer gate 13A is the second output terminal (scan output terminal SO) of the slave latch 13, and is electrically coupled to the input of the inverter 13B. The output of the transfer gate 13C is the second output terminal (scan output terminal SO) of the slave latch 13, and is electrically coupled to the input of the inverter 13B, like the output of the transfer gate 13A. In other words, the connection terminal between the transfer gates 13A and 13C and the inverter 13B is the scan output terminal SO. The scan output terminal SO is electrically directly coupled to a scan input terminal SI of the second flip-flop 20.

The slave latch 13 of the first flip-flop 10 outputs a signal based on the signal from the master latch 12 from the output of the transfer gate 13A to the input of the inverter 13B, and also outputs the signal based on the signal from the master latch 12 from the output of the transfer gate 13A to the input circuit 21 of the second flip-flop 20.

(Scan Test of Second Embodiment)

The scan test of the semiconductor integrated circuit according to the second embodiment will be described next.

In a scan test mode, a test enable signal TE is set to "H" level, and the input circuit 11 of the first flip-flop 10 selects a scan test data signal TI1. The input circuit 11 thus outputs the inverted signal of the scan test data signal TI1 via a clocked inverter 11B.

Next, the master latch 12 of the first flip-flop 10 receives the output signal from the input circuit 11. The master latch 12 then outputs the normal signal of the scan test data signal TI1 via a transfer gate 12A and an inverter 12B.

The slave latch 13 of the first flip-flop 10 receives the output signal from the master latch 12. The slave latch 13 outputs the normal signal of the scan test data signal TI1 from the scan output terminal SO via the transfer gate 13A. The output signal from the scan output terminal SO is a signal having the same phase as an output signal Q1 output from a normal output terminal Q via the transfer gate 13A and the inverters 13B and 14A. The output signal from the scan output terminal SO is input to the scan input terminal SI of the second flip-flop 20.

After that, the input circuit 21 of the second flip-flop 20 selects a scan test data signal TI2. The normal signal of the scan test data signal TI2 is output from the scan output terminal SO via the input circuit 21, the master latch 22, the slave latch 23, and the output circuit 24 of the second flip-flop 20, as in the operations of the input circuit 11, the master latch 12, the slave latch 13, and the output circuit 14 of the first flip-flop 10.

Effects of Second Embodiment

According to the second embodiment, in the multi-bit flip-flop, the slave latch 13 of the first flip-flop 10 has the first output terminal and the second output terminal. The first output terminal is the output of the inverter 13B of the slave latch 13, and is electrically coupled to the normal output terminal Q via the output circuit 14. On the other hand, the second output terminal is the output of the transfer gate 13A of the slave latch 13, which outputs a signal having the same phase as the normal output terminal Q. The second output terminal serves as the scan output terminal SO. Hence, the same effects as in the first embodiment can be obtained.

Third Embodiment

A semiconductor integrated circuit according to the third embodiment will be described below with reference to FIGS. 4 and 5.

In the first embodiment, the output of the inverter 13D of the slave latch 13 serves as the scan output terminal SO. In the third embodiment, however, the connection terminal between a slave latch 13 and an output circuit 14 serves as a scan output terminal SO. With this arrangement, the same effects as in the first embodiment can be obtained.

The third embodiment will be described below in detail. Note that a description of the same points as in the first embodiment will be omitted in the third embodiment, and different points will mainly be explained.

(Arrangement Example of Third Embodiment)

An arrangement example of the semiconductor integrated circuit according to the third embodiment will be described first.

Figure 4:
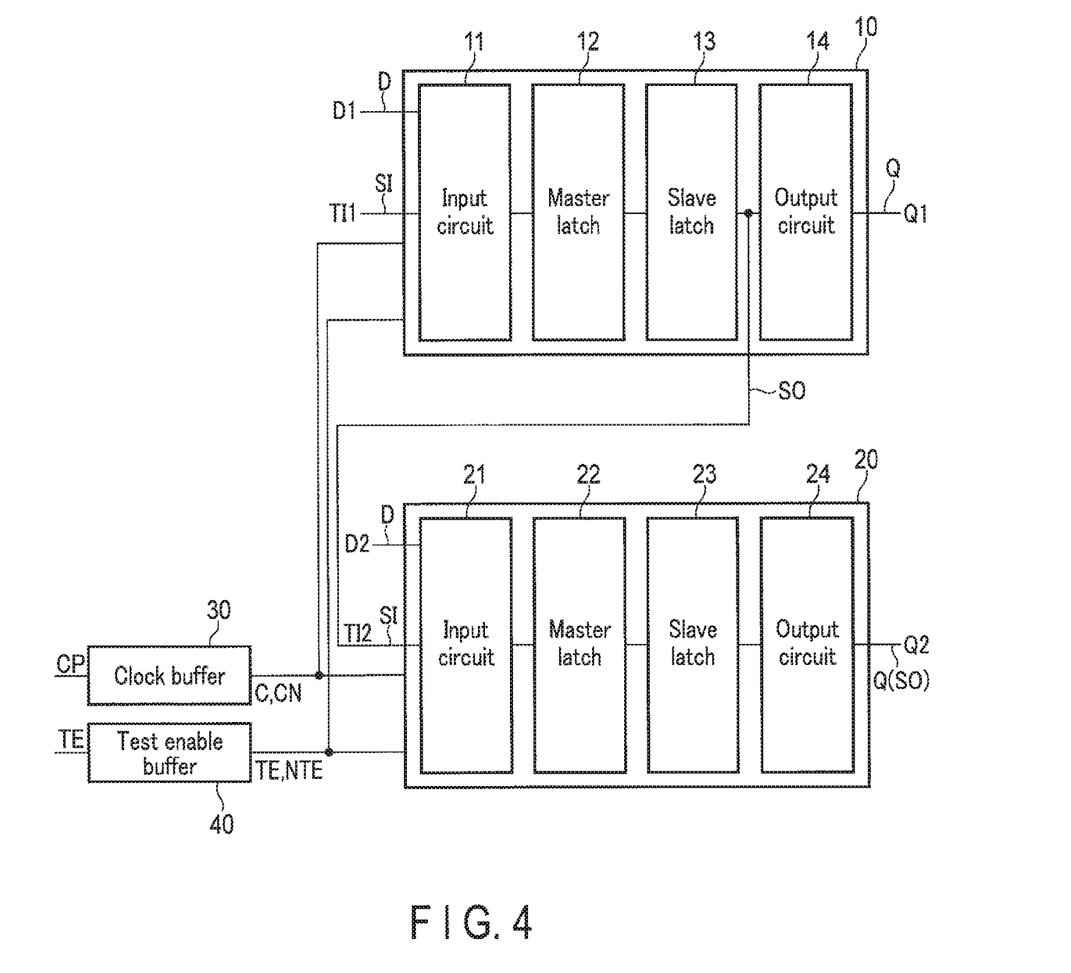
FIG. 4 is a block diagram showing a semiconductor integrated circuit according to the third embodiment.

FIG. 4 is a block diagram showing the semiconductor integrated circuit according to the third embodiment. FIG. 4 shows a 2-stage multi-bit flip-flop including a first flip-flop 10 and a second flip-flop 20.

As shown in FIG. 4, the slave latch 13 has an input terminal and an output terminal. The input terminal of the slave latch 13 is electrically coupled to the output terminal of a master latch 12. The output circuit 14 has an input terminal and an output terminal (normal output terminal Q). The input terminal of the output circuit 14 is electrically coupled to the output terminal of the slave latch 13. The connection terminal between the output of the slave latch 13 and the input of the output circuit 14 is the scan output terminal SO.

Figure 5:
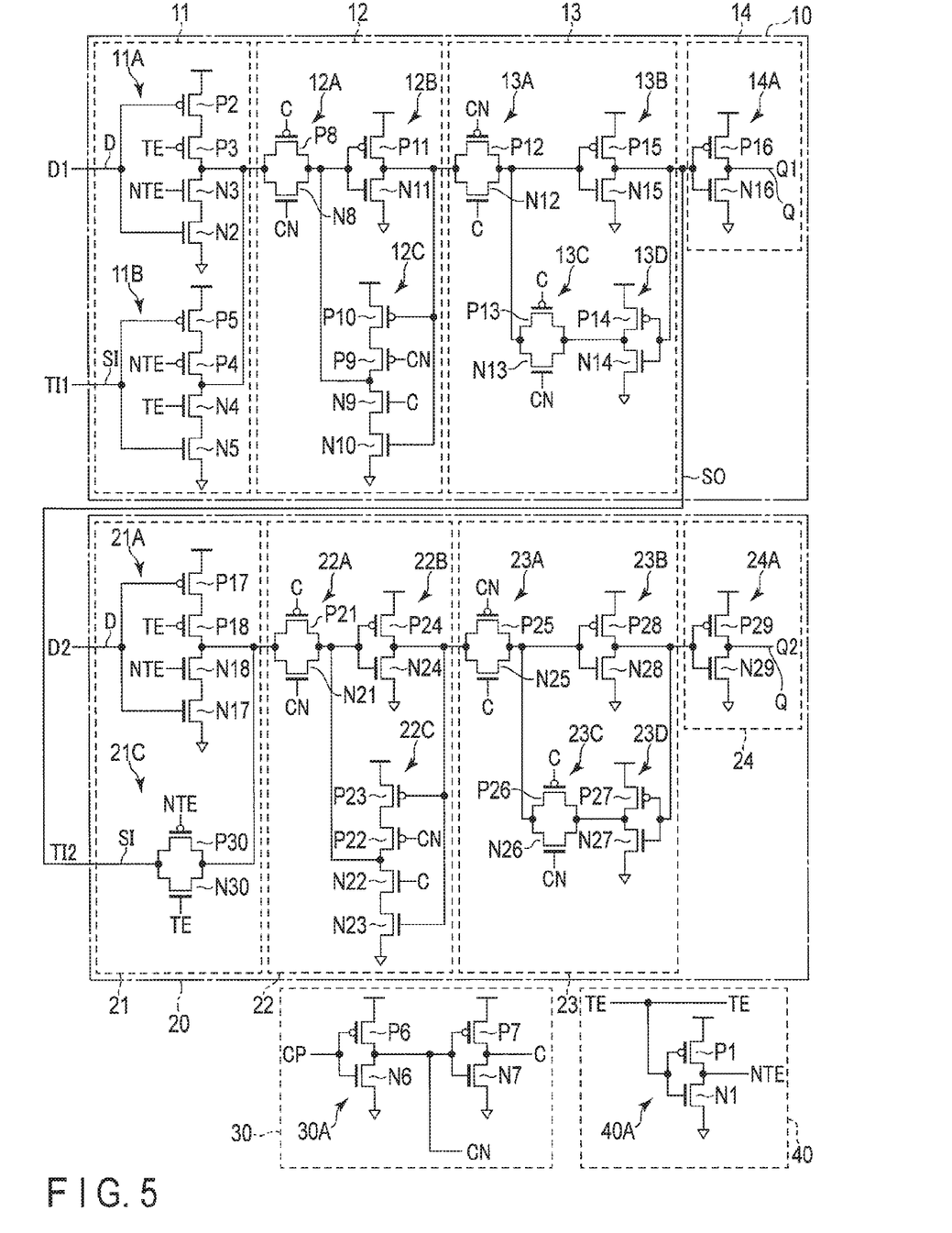
FIG. 5 is a circuit diagram showing the semiconductor integrated circuit according to the third embodiment.

FIG. 5 is a circuit diagram showing the semiconductor integrated circuit according to the third embodiment. FIG. 5 illustrates details of the first flip-flop 10 (an input circuit 11, the master latch 12, the slave latch 13, and the output circuit 14), the second flip-flop 20 (an input circuit 21, a master latch 22, a slave latch 23, and an output circuit 24), a clock buffer 30, and a test enable buffer 40 shown in FIG. 4.

As shown in FIG. 5, the output of an inverter 13B of the slave latch 13 in the first flip-flop 10 is the scan output terminal SO, and is electrically coupled to the input of the output circuit 14. In other words, the connection terminal between the inverter 13B and an inverter 14A is the scan output terminal SO. The scan output terminal SO is electrically directly coupled to a scan input terminal SI of the second flip-flop 20.

The input circuit 21 of the second flip-flop 20 includes a clocked inverter 21A and a transfer gate 21C.

The input of the clocked inverter 21A is the first input terminal (normal input terminal D) of the input circuit 21, and the output is the output terminal of the input circuit 21. The input of the transfer gate 21C is the second input terminal (scan input terminal SI) of the input circuit 21, and the output is the output terminal of the input circuit 21, like the output of the clocked inverter 21A.

More specifically, the transfer gate 21C includes a PMOS transistor P30 and an NMOS transistor N30.

One terminal of the PMOS transistor P30 is electrically coupled to one terminal of the NMOS transistor N30, and the other terminal of the PMOS transistor P30 is electrically coupled to the other terminal of the NMOS transistor N30. The one terminal of the PMOS transistor P30 and the one terminal of the NMOS transistor N30 form the input of the transfer gate 21C, and the other terminal of the PMOS transistor P30 and the other terminal of the NMOS transistor N30 form the output of the transfer gate 21C. An inverted test enable signal NTE is input to the gate of the PMOS transistor P30, and a test enable signal TE is input to the gate of the NMOS transistor N30.

The slave latch 13 of the first flip-flop 10 outputs a signal based on the signal from the master latch 12 from the output of the inverter 13B to the input of the inverter 14A of the output circuit 14, and also outputs the signal based on the signal from the master latch 12 from the output of the inverter 13B to the input circuit 21 of the second flip-flop 20.

(Scan Test of Third Embodiment)

The scan test of the semiconductor integrated circuit according to the third embodiment will be described next.

In a scan test mode, first, the test enable signal TE is set to "H" level, and the input circuit 11 of the first flip-flop 10 selects a scan test data signal TI1. The input circuit 11 thus outputs the inverted signal of the scan test data signal TI1 via a clocked inverter 11B.

Next, the master latch 12 of the first flip-flop 10 receives the output signal from the input circuit 11. The master latch 12 then outputs the normal signal of the scan test data signal TI1 via a transfer gate 12A and an inverter 12B.

The slave latch 13 of the first flip-flop 10 receives the output signal from the master latch 12. The slave latch 13 outputs the inverted signal of the scan test data signal TI1 from the scan output terminal SO via a transfer gate 13A and the inverter 13B. The output signal from the scan output terminal SO is a signal having a phase opposite to that of an output signal Q1 output from a normal output terminal Q via the transfer gate 13A and the inverters 13B and 14A. The output signal from the scan output terminal SO is input to the scan input terminal SI of the second flip-flop 20.

After that, since the test enable signal TE is set to "H" level, the PMOS transistor P30 and the NMOS transistor N30 are turned on, and a PMOS transistor P18 and an NMOS transistor N18 are turned off. That is, the input circuit 21 of the second flip-flop 20 selects a scan test data signal TI2. At this time, the input circuit 21 outputs the normal signal of the scan test data signal TI2 (the inverted signal of the scan test data signal TI1) via the transfer gate 21C. The output signal from the input circuit 21 according to the third embodiment has the same phase as the output signal from the input circuit 21 according to the first embodiment. For this reason, the subsequent operations of the master latch 22, the slave latch 23, and the output circuit 24 according to the third embodiment are performed like the operations of the master latch 22, the slave latch 23, and the output circuit 24 according to the first embodiment.

Effects of Third Embodiment

According to the third embodiment, in the multi-bit flip-flop, the output terminal of the slave latch 13 of the first flip-flop 10 is electrically coupled to the normal output terminal Q via the output circuit 14. The output terminal of the slave latch 13 is the output of the inverter 13B of the slave latch 13, which outputs a signal having a phase opposite to the normal output terminal Q. The output terminal also serves as the scan output terminal SO, and is electrically coupled to the scan input terminal SI of the second flip-flop 20. The scan input terminal SI of the second flip-flop 20 is the input of the transfer gate 21C. Hence, the same effects as in the first embodiment can be obtained.

According to the third embodiment, in the second flip-flop 20, the input of the transfer gate 21C is the scan input terminal SI. It is therefore possible to decrease the number of transistors as compared to the clocked inverter 21B of the first embodiment and reduce the circuit area.

While certain embodiments have been described, these embodiments have been presented by way of examples only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
a first flip-flop including a first input circuit, a first latch, a second latch, and a first output circuit;
a second flip-flop including a second input circuit, a third latch, a fourth latch, and a second output circuit; and
a clock buffer configured to output a common clock signal to the first flip-flop and the second flip-flop,
wherein a first output terminal of the second latch is coupled to an input terminal of the first output circuit, and a second output terminal of the second latch is directly coupled to an input terminal of the second input circuit, and
the second input circuit comprises a clocked inverter having an input coupled to the second output terminal of the second latch.

2. The circuit of claim 1, wherein the second output terminal of the second latch and an output terminal of the first output circuit output signals having the same phase.

3. The circuit of claim 1, wherein the second latch comprises a first transfer gate, a first inverter having an input coupled to an output of the first transfer gate, a second inverter having an input coupled to an output of the first inverter, and a second transfer gate having an input coupled to an output of the second inverter and an output coupled to the output of the first transfer gate and the input of the first inverter, and the second output terminal of the second latch is a connection terminal between the output of the second inverter and the input of the second transfer gate.

4. The circuit of claim 1, wherein the second latch comprises a first transfer gate, a first inverter having an input coupled to an output of the first transfer gate, a second inverter having an input coupled to an output of the first inverter, and a second transfer gate having an input coupled to an output of the second inverter and an output coupled to the output of the first transfer gate and the input of the first inverter, and the second output terminal of the second latch is a connection terminal between the output of the first transfer gate, the input of the first inverter, and the output of the second transfer gate.

5. The circuit of claim 1, wherein each of the first latch and the third latch comprises a master latch, and each of the second latch and the fourth latch comprises a slave latch.

6. The circuit of claim 1, wherein an output terminal of the first input circuit is coupled to an input terminal of the first latch, and an output terminal of the first latch is coupled to an input terminal of the second latch.

7. The circuit of claim 1, wherein an output terminal of the second input circuit is coupled to an input terminal of the third latch, an output terminal of the third latch is coupled to an input terminal of the fourth latch, and an output terminal of the fourth latch is coupled to an input terminal of the second output circuit.

* * * * *